(12) United States Patent
Wright et al.

(10) Patent No.: US 7,005,777 B2
(45) Date of Patent: Feb. 28, 2006

(54) TAPERED PIEZOELECTRIC IN-PLANE BIMORPH AND METHOD OF FABRICATING

(75) Inventors: John Stuart Wright, Minneapolis, MN (US); James Morgan Murphy, Boulder, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 545 days.

(21) Appl. No.: 10/042,926

(22) Filed: Jan. 9, 2002

(65) Prior Publication Data

US 2004/0010896 A1      Jan. 22, 2004

Related U.S. Application Data

(60) Provisional application No. 60/260,755, filed on Jan. 10, 2001.

(51) Int. Cl.
    *H01L 41/08*      (2006.01)
(52) U.S. Cl. .................................................. 310/328
(58) Field of Classification Search ................ 310/328, 310/339, 359, 357, 331, 363, 353, 332; 29/25.35, 29/846–847, 4.17; H01L 41/08; H04R 1/17
    See application file for complete search history.

(56) References Cited

U.S. PATENT DOCUMENTS

| | | | | |
|---|---|---|---|---|
| 5,490,422 A | * | 2/1996 | Tabota et al. ............. 73/514.34 |
| 5,689,380 A | * | 11/1997 | Um ............................. 359/846 |
| 6,118,637 A | | 9/2000 | Wright et al. ............. 360/294.4 |
| 6,246,155 B1 | * | 6/2001 | Nishihara et al. ........... 310/328 |
| 6,550,116 B1 | * | 4/2003 | Nishihara et al. .......... 29/25.35 |
| 6,615,465 B1 | * | 9/2003 | Otsuchi et al. ............ 29/25.35 |
| 6,619,124 B1 | * | 9/2003 | Ogiura ..................... 73/514.34 |

OTHER PUBLICATIONS

U.S. Appl. No. 09/553,220, filed Apr. 20, 2000, Boutaghou et al.
U.S. Appl. No. 09/553,523, filed Apr. 20, 2000, Murphy et al.
U.S. Appl. No. 09/876,463, filed Jun. 7, 2001, Murphy et al.

* cited by examiner

*Primary Examiner*—Darren Schuberg
*Assistant Examiner*—Karen Beth Addison
(74) *Attorney, Agent, or Firm*—Kinney & Lange, P.A.

(57) ABSTRACT

Tapered elements fabricated from a substrate of a size many times that of a single element are disclosed. Such tapered elements may be used as piezoelectric microactuators such as in-plane piezoelectric bimorph microactuators. A unique method of fabricating such tapered elements is provided. According to the method, cutting directions are first defined, the substrate is then cut a plurality of times in each cutting direction with adjacent cuts in each cutting direction indexed by proper indexing distances which are determined based on the dimensions of the final tapered elements. In one embodiment of the method, a plurality of optically detectable marks are used to define the cutting directions and cutting means is accordingly optically aligned with the cutting directions.

26 Claims, 6 Drawing Sheets

TAPERED PIEZOELECTRIC IN-PLANE BIMORPH AND METHOD OF FABRICATING

CROSS-REFERENCE TO RELATED APPLICATION(S)

This application claims priority from Provisional Application No. 60/260,755 filed Jan. 10, 2001 for "Fabricating Tapered Piezoelectric In-plane Bimorph" by John S. Wright and James M. Murphy.

BACKGROUND OF THE INVENTION

The present invention relates to fabricating elements or devices from a substrate having a size many times greater than that of a single element. More particularly, the present invention relates to tapered piezoelectric in-plane bimorphs and method of fabricating such bimorphs from a substrate of a size many times that of a single bimorph, wherein each bimorph has two angled opposing sides, a top having a top width, and a bottom having a bottom width which is greater than the top width.

As the areal density of concentric data tracks on magnetic discs continues to increase (that is, the size of data tracks and radial spacing between data tracks are decreasing), more precise head positioning is required. Head positioning in a hard disc includes two distinct but related aspects: tracking control (i.e., radial positioning of the head) and fly-height control (i.e., head-media spacing). Both aspects are important considerations for the hard discs in the future.

Conventionally, tracking control (radial head positioning) is accomplished by operating an actuator arm with a large-scale actuation motor, such as a voice coil motor, to radially position a head on a flexure at the end of the actuator arm. The large-scale motor lacks sufficient resolution to effectively accommodate high track-density discs. Thus, a high resolution head positioning mechanism, or microactuator, is necessary to accommodate the more densely spaced tracks.

One promising approach for high resolution tracking control involves employing a high resolution microactuator in addition to the conventional lower resolution actuator motor, thereby effecting head positioning through dual-stage actuation.

Conventionally, fly-height control is primarily accomplished using passive adjustments based on air bearing design. More recent disc drives, however, have started to use high resolution microactuation methods for actively controlling transducer head fly-height.

Various microactuator designs have been considered to accomplish high resolution head positioning. Some designs are employed to deform disc drive components such as the actuator arm or the flexure in order to achieve minute displacements by bending. Other designs introduce a separate microactuator component at an interface between disc drive components. U.S. Pat. No. 6,118,637 to Wright et al., for example, discloses an assembly including a gimbal, a piezoelectric element bonded to the gimbal and electrically connected to a voltage source, and a slider connected to the piezoelectric element. In the Wright patent, the microactuator (the piezoelectric element) is a separate unit that operates to change position of the entire slider.

The existing problems in the prior art schemes for a high resolution microactuator include difficulties in fabrication, large activation voltages required for deforming materials a sufficient amount to control the transducer position, lack of fast response bandwidth required in disc operation, and simplicity of implementation. To solve or alleviate these problems, careful considerations must be given to the type of the materials used to build the microactuator, internal structural designs of the microactuator, and location of the microactuator in the disc drive.

Among various microactuators used for high precision head positioning, piezoelectric microactuators are one of the most important. Among piezoelectric microactuators, piezoelectric bimorph microactuators are often used because they provide better performance than unimorph microactuators in many situations.

The piezoelectric bimorphs are well known in the industry. Such bimorphs are often used as transducers or microactuators. In general, a piezoelectric bimorph microactuator utilizes the opposite mechanical response of two pieces or regions of piezoelectric material to create a combined effect of bending. Depending on the bending direction, a piezoelectric bimorph microactuator can either be an out-plane type or in-plane type. A typical out-plane piezoelectric bimorph has two oppositely poled piezoelectric layers stacked and bonded together through a central electrode layer. As the two oppositely poled layers are activated such that one-layer expands and the other layer contracts, the bimorph will bend in a direction perpendicular to the direction of expansion and contraction (the length direction) because the two piezoelectric layers cannot move relative to each other.

In comparison, an in-plane piezoelectric bimorph microactuator has two opposing piezoelectric layers that are bonded side-by-side. As a result, the bimorph bends laterally in the planes of the piezoelectric layers instead of vertically when the two layers experience differential expansion (or contraction). It has been suggested that in-plane bimorph microactuators be used to effect a lateral microactuation in the disc drive.

U.S. application Ser. No. 09/876,463, filed Jun. 7, 2001, entitled "Combined Servo-Tracking and Preload-Controlling Microactuator", describes a tapered piezoelectric in-plane bimorph microactuator located on the suspension loadbeam to bend the loadbeam. A tapered piezoelectric in-plane bimorph microactuator disclosed in that invention has two angled opposing sides, a top having a top width, and a bottom having a bottom width which is greater than the top width.

The tapered bimorph design helps to achieve a broader servo bandwidth (i.e., higher response frequency) and may be adapted to uses with many types of in-plane biomorph microactuators. The tapered design, however, also presents challenges in dicing operation during fabrication of the piezoelectric microactuators due to their two non-parallel sides.

BRIEF SUMMARY OF THE INVENTION

The present invention relates to tapered devices or elements, such as in-plane piezoelectric bimorphs (IPB), fabricated from a substrate of a size many times that of a single element using a unique fabricating method. Each tapered element has two angled opposing sides, a top having a top width, and a bottom having a bottom width which is greater than the top width.

The fabricating method comprises: 1) providing a substrate having first and second major surfaces; 2) defining a first and second cutting directions that form an angle in relation to each other; 3) cutting the substrate a plurality of times along the first cutting direction to result in a first set of cuts, each cut being spaced from an adjacent cut by a first predetermined indexing distance; and 4) cutting the substrate a plurality of times along the second cutting direction resulting in second set of cuts, each cut being spaced from an adjacent cut by a second predetermined indexing distance.

The above cutting scheme determines the basic features of tapered elements each having two angled opposing sides and a bottom width. To further determine the proper dimensions of an element in its length, the method further includes 1) defining a third cutting direction which transverses both the first and second cutting directions; and 3) cutting the substrate a plurality of times along the third cutting direction to result in a third set of cuts, each cut being spaced from an adjacent cut by a third predetermined indexing distance.

In one embodiment, a plurality of optically detectable marks are used to define the cutting directions. Cutting means is accordingly optically aligned with the cutting directions.

DETAILED DESCRIPTION

The present invention involves a method of efficiently fabricating tapered elements from a substrate having a size many times that of a single element. In the present application, the term element and elements are used to represent a single piece or pieces of a material formed as a result of cutting a larger substrate. Such piece or pieces are often called "die" or "dice". Unless specified otherwise, the term elements or element does not suggest a particular geometric shape thereof or a particular cutting method used to cut the substrate. The substrate may be either a wafer or a smaller piece of a wafer resulted from cutting the wafer (e.g., a wafer bar cut from a wafer).

The elements are used, or further adapted to be used, as devices such as transducers or microactuators. In the present disclosure, the method is illustrated using a process for making in-plane piezoelectric bimorph elements from a piezoelectric substrate. The resultant piezoelectric bimorph elements are used as transducers or microactuators. However, the inventive method involving unique cutting and indexing schemes is applicable in a process of making other tapered elements used for different purposes from a corresponding substrate.

Figure 1:
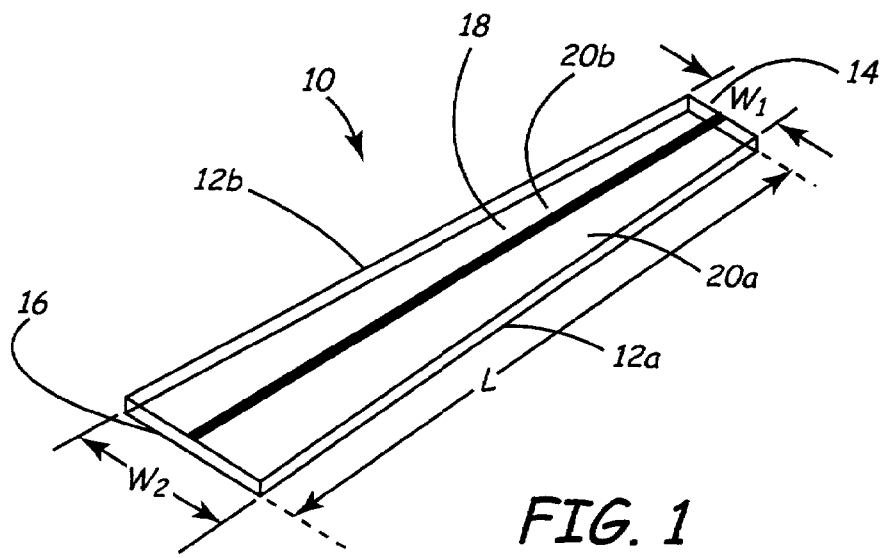
FIG. 1 is a perspective view of a tapered in-plane bimorph to be made using the inventive method.

FIG. 1 shows a tapered in-plane piezoelectric bimorph 10 as an exemplary element made in accordance with the present invention. The tapered in-plane bimorph 10 has two angled opposing sides 12a and 12b, a top 14, a bottom 16, and a central isolation trench 18 which divides bimorph 10 into two portions 20a and 20b. In the example shown in FIG. 1, tapered in-plane bimorph 10 has a trapezoid shape in which top 14 and bottom 16 are parallel to each other. Isolation trench 18 is a narrow rail dividing the bimorph into two halves 20a and 20b.

Tapered bimorph 10 has an overall length L measured vertically from top 14 to bottom 16. Top 14 has a top width $w_1$. Bottom 16 has a bottom width $w_2$ which is greater than $w_1$. As a result, sides 12a and 12b are non-parallel.

Figure 2:
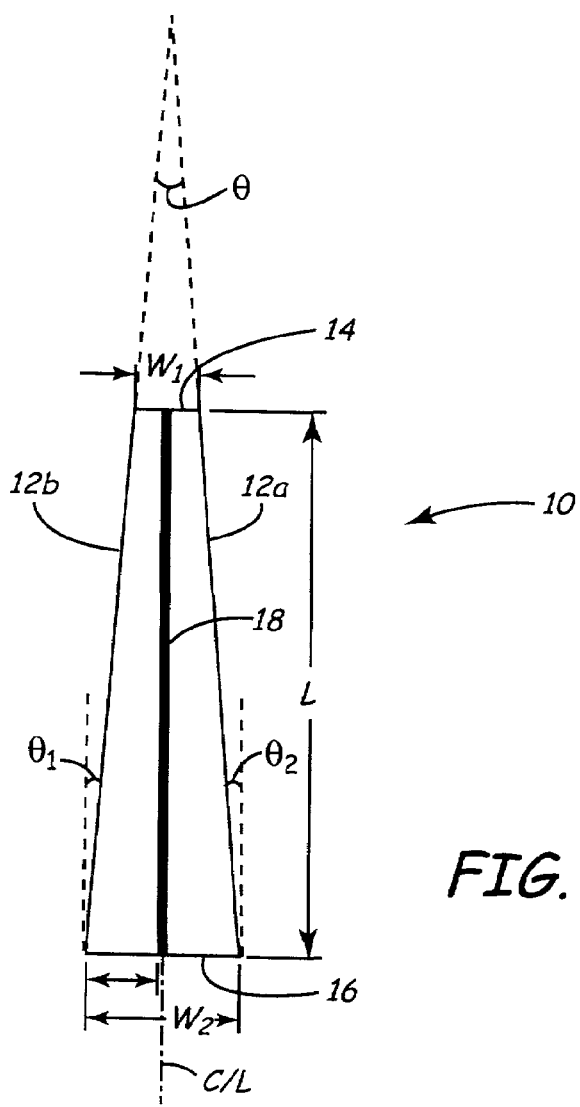
FIG. 2 is a front schematic view of a tapered in-plane bimorph to be made using the inventive method.

FIG. 2 further illustrates the tapered configuration of in-plane piezoelectric bimorph 10. In FIG. 2, sides 12a and 12b are shown in phantom to intersect with each other at an angle θ which represents a feature angle of the tapered piezoelectric bimorph 10. Isolation trench 18 runs along a central line CL on piezoelectric bimorph 10 to symmetrically divide the bimorph into two halves 20a and 20b which are equal-sized with reversed shapes. Central line CL forms first and second partial angles $θ_1$ and $θ_2$ with side 12a and 12b respectfully. Based on basic trigonometry, $θ_1+θ_2=θ$. In the particular example shown in FIG. 2, partial angles $θ_1$ and $θ_2$ are equal to each other. Tapered in-plane piezoelectric bimorph 10 is therefore geometrically symmetric in relation to the central line CL. As illustrated herein, however, as long as the bimorph 10 is tapered, other geometric characteristics such as symmetry are not required.

A tapered in-plane piezoelectric bimorph as shown above is thus a trapezoid shaped piezoelectric device wider at its base than at its top, in contrast to a straight (i.e., rectangular shaped) in-plane bimorph which has a uniform width.

Figure 3:
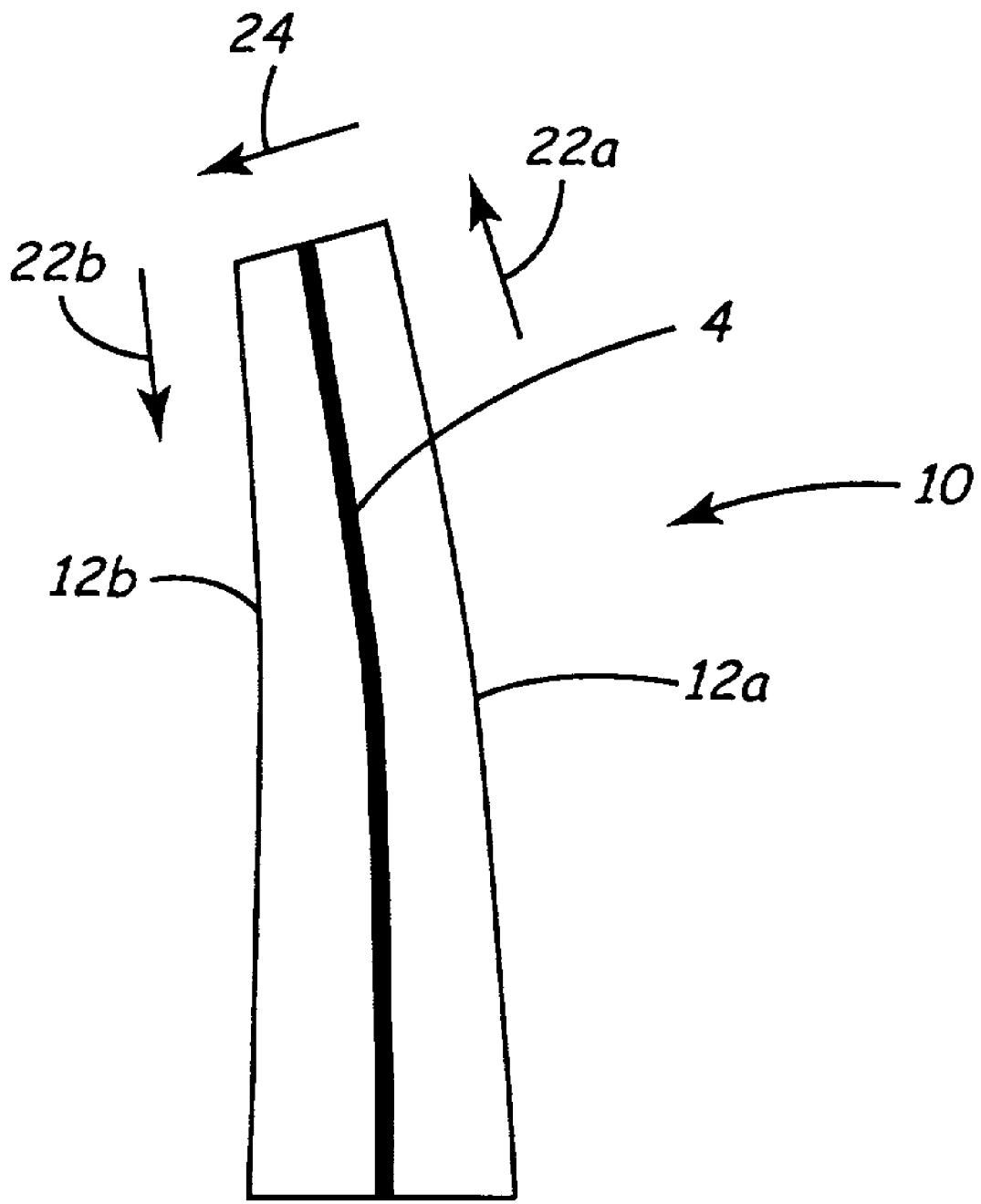
FIG. 3 illustrates how a tapered in-plane bimorph made using the inventive method.

FIG. 3 illustrates how tapered in-plane piezoelectric bimorph 10 bends laterally when activated by applying a voltage in the thickness direction to two piezoelectric halves 12a and 12b. Two piezoelectric halves 12a and 12b are poled (polarized) across the thickness dimension but in opposite directions with respect to each other. Upon applying the same potential (electric voltage) on halves 12a and 2b, one half (such as 12a) expands (in a direction as illustrated by arrow 22a) while the other half (12b) contracts (in a direction as illustrated by 22b). Because two halves 12a and 12b are bonded side-by-side and cannot move relatively to each other in the length direction, the in-plane piezoelectric bimorph 10 bends laterally in a direction illustrated by arrow 24.

The above described lateral bending mechanism is similar to that of a straight in-plane bimorph. Compared to a straight in-plane bimorph, however, it has been shown through modeling that a tapered in-plane piezoelectric bimorph has the greater sway-mode resonant frequency and thus potentially provides a better bandwidth.

Typically, bimorphs are prepared by dicing a suitable substrate of size many times that of a single bimorph. The challenge in preparing tapered in-plane bimorphs 10 as shown above is in dicing due to the non-parallel sides 12a and 12b. The present invention provides a method of effectively cutting the substrate into a plurality of tapered bimorphs using a unique way of defining cutting directions and indexing multiple cuttings in each cutting direction. In one embodiment, the method involves marking, patterning, optical aligning and indexing to enable dicing at a proper angle in a batch production. An embodiment of the method is explained in detail with reference to FIGS. 4–8 as follows.

Figure 4:
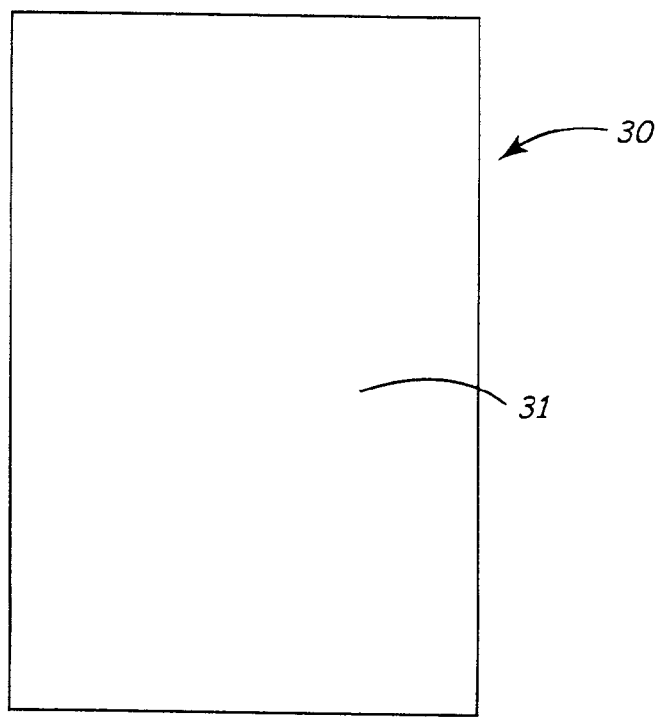
FIG. 4 shows a surface of a substrate material for making tapered in-plane bimorphs in accordance with the present invention.

FIG. 4 illustrates a substrate material 30 suitable for making in-plane piezoelectric bimorphs. Substrate 30 has a major surface 31 and an opposing major surface (not shown).

Figure 5:
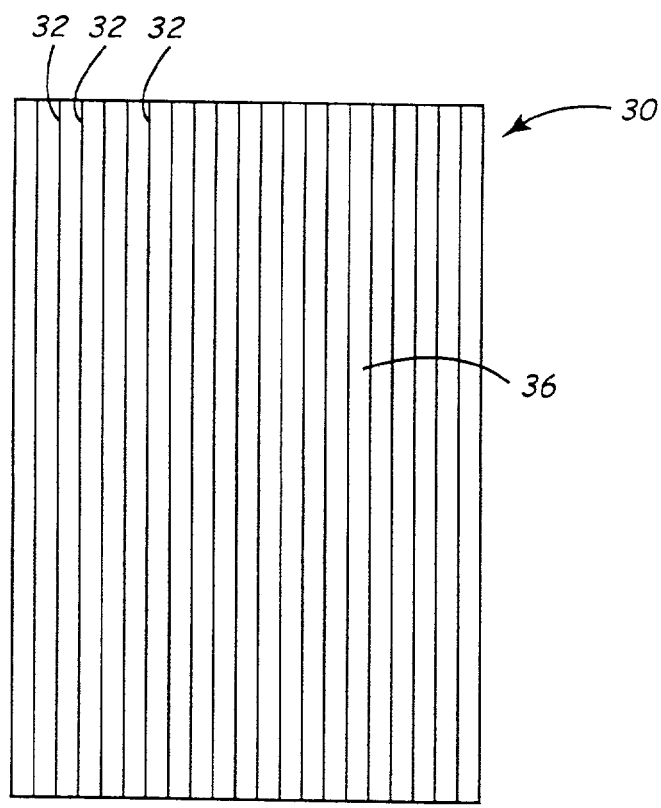
FIG. 5 is a schematic view of the substrate patterned by forming isolation trenches.

In FIG. 5, the substrate 30 is patterned by forming isolation trenches 32 which are to be adapted to function as the isolation trenches 18 between the two halves 12a and 12b of tapered piezoelectric bimorphs as shown in FIGS. 1–2. These isolation trenches (e.g., 18 in FIGS. 1–2) function to electrically isolate two halves of a biomorph to allow poling (polarization) of the halves in opposite directions with respect to each other. The isolation trenches 32 form a pattern of parallel lines 32 spaced by a distance which is the same as the bottom width $w_2$ of a final bimorph as shown in FIGS. 1–2.

As known in the art, when a PZT material is formed, regions of the polycrystalline ceramic spontaneously form into domains each having a permanent electric dipole. Because the electric dipoles of these domains are initially randomly oriented, the PZT material cannot be used as a piezoelectric device. It is therefore necessary to "pole" the ceramic material to cause most of the electric dipole domains to be aligned up in the same direction. The poled material can then be used as a piezoelectric device. For conventional poling, isolation trenches 32 are not required. In the embodiment of in-plane piezoelectric biomorphs, however, because the two halves of the biomorph need to be poled in opposite directions in order for the in-plane biomorph to function as an transducer or microactuator having transducing or bending effect as described herein, it is necessary that the two halves of the biomorph are electrically insulated from each other before poling.

Figure 6:
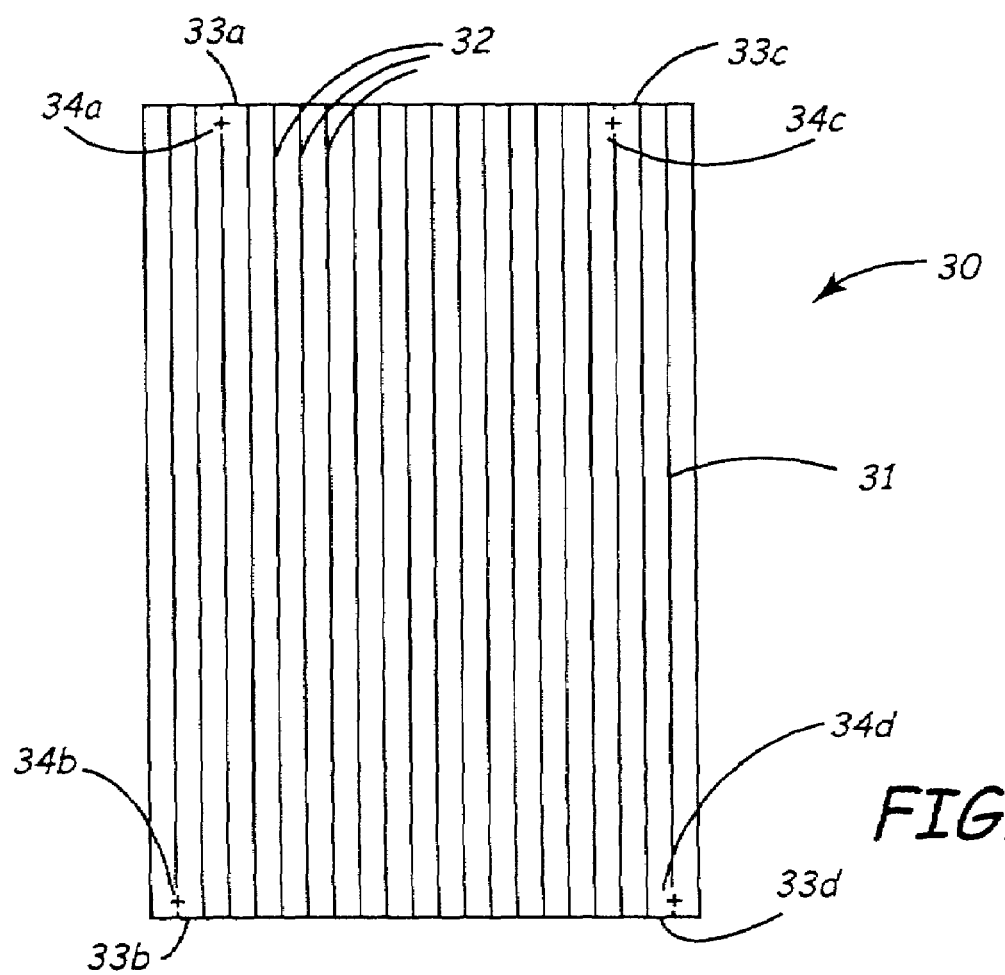
FIG. 6 shows fiducial marks on the substrate patterned by forming isolation trenches.

In FIG. 6, fiducial marks 34a, 34b, 34c and 34d are then formed on surface 31 of substrate 30. These fiducial marks are used as reference points to define proper cutting angles.

Specifically, the first and second fiducial marks 34a and 34b define a first cutting direction, and the third and fourth fiducial marks 34c and 34d define a second cutting direction. The first direction forms a first angle $\theta_1$ with respect to the parallel isolation trenches 32, and the second direction forms a second angle $\theta_2$ with respect to the parallel isolation trenches 32. Since isolation trenches 32 correspond to the center (C/L) of each tapered piezoelectric bimorph (FIG. 2), the first and second cutting directions thus correspond to the orientations of the first and second opposing angled sides in the tapered piezoelectric bimorphs (FIG. 2).

The first and the third fiducial marks 34a and 34c (or alternatively, the second and the fourth fiducial marks 34b and 34d) define a third cutting direction. This direction is perpendicular to isolation trenches 32 and thus corresponds to the orientations of the top and bottom in the tapered piezoelectric bimorphs (FIG. 2).

Substrate 30 is then diced (cut) using a procedure described in detail as follows.

1. Optically align a dicing means (such as a dicing blade) such that the dicing means has a first start point indicated by the first fiducial mark 34a (at the upper left side of substrate 34).

2. Optically align the dicing means such that the dicing means has a first end point indicated by the second fiducial mark 34b (at the lower left side of substrate 34, defining the first cutting direction with the first fiducial mark 34a).

3. Optically align the dicing means such that the dicing means has a second start point indicated by the third fiducial mark 34c (at the of upper right side of substrate 34).

4. Optically align the dicing means such that the dicing means has a second end point indicated by the fourth fiducial mark 34d (at the lower right side of substrate 34, defining the second cutting direction with the third fiducial mark 34c); The two angled side-cutting directions with dicing angles $\theta_1$ and $\theta_2$ with respect to the isolation trenches are now set.

5. Optically align the dicing means such that it has a third start point dictated by the first fiducial mark 34a.

6. Optically align the dicing means such that it has a third end point indicated by the third fiducial mark 34c. The transverse dicing direction with respect to the isolation trenches is now set.

7. Set proper indexing for repetitive cutting at each cutting directions (the two angled side-cutting directions and the transverse cutting direction) based on the desired dimensions of the final individual elements. Indexing entails determining an indexing distance by which two adjacent cuttings performed in a certain cutting direction are spaced apart. For example, cuttings in each direction may be equidistant (i.e., having a uniform indexing distance among the cuttings in that particular cutting direction). The indexing distances in the two angled side-cutting directions may be the same as the bottom width $w_2$ of the final in-plane bimorphs (FIG. 2), and the indexing distance in the transverse cutting direction may be the same as the length L of the final in-plane bimorphs.

8. Cut the substrate a plurality of times in each cutting direction according to the cutting directions and corresponding indexing distances determined as described above.

Figure 7:
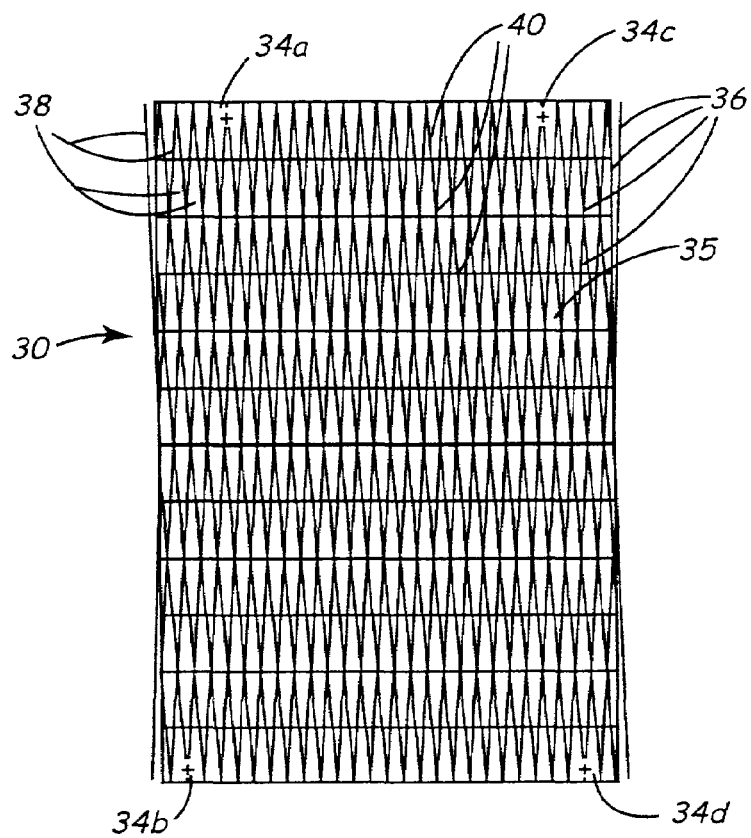
FIG. 7 is a schematic view of a dicing pattern showing dicing lanes in accordance with the present invention.

FIG. 7 illustrates cutting patterns (direction and indexing) on substrate 30. A first set of parallel cutting lines 36 represent the cuttings performed in the first angled side-cutting direction, a second set of parallel cutting lines 38 represent the cuttings performed in the second angled side-cutting direction, and a third set of parallel cutting lines 40 to present the cuttings performed in the transverse cutting direction.

Figure 8:
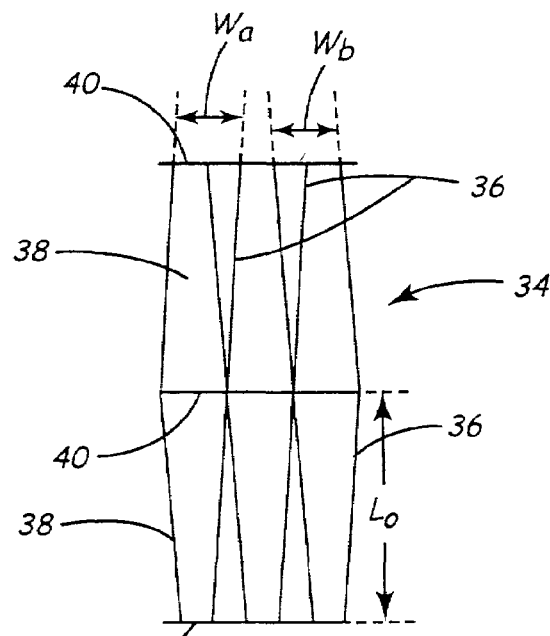
FIG. 8 is an enlarged section of the dicing pattern in FIG. 7.

FIG. 8 is an enlarged small section 35 of the dicing pattern on the substrate 30 shown in FIG. 7. As shown more clearly in the enlargement in FIG. 8, cutting lines 36 are parallel to each other and spaced by a distance $w_a$, presenting cuttings performed in the first angled side-cutting direction with equidistant indexing for repetitive cutting in that direction. Cutting lines 38 are parallel to each other and spaced by a distance $w_b$, presenting cuttings performed in the second angled side-cutting direction with equidistant indexing for repetitive cutting in that direction. Cutting lines 40 are parallel to each other and spaced by a distance $L_0$, representing cuttings performed in the transverse cutting direction with equidistant indexing for repetitive cutting in that direction.

Proper indexing for repetitive cutting in each direction is based on the dimensions of the final individual elements. In the particular dicing pattern as shown in FIGS. 7 and 8, indexing distances $w_a$ and $w_b$ in the first and second angled side-cutting directions are set to be uniform in each direction and further equal to each other between both directions, indexing distance $L_0$ in the transverse cutting direction is also set to be uniform. Such indexing scheme result in identical individual elements. Specifically, in this particular embodiment, $w_a=w_b=w_2$, where $w_2$ is bottom width $w_2$ of the final bimorph 10 in FIG. 2, and $L_0=L$, where L is the length L of the final bimorph 10 in FIG. 2.

The above described embodiment of the inventive method is for the purpose of illustration only. The method in accordance with the present invention has broader applications.

In general, although the embodiment involves making of in-plane piezoelectric bimorphs, the inventive method may be used to cut a substrate of other materials into its corresponding elements.

The particular embodiment as illustrated above results in trapezoid shaped elements with two parallel sides (a top and a bottom), two angled opposing sides and a central line dividing the element into to equivalent halves. The inventive method, however, can be used to make elements having other shapes, either simpler or more complex than the trapezoid elements. For example, rhombus (diamond) shaped elements will result if no cutting in the transverse direction is performed. These rhombus shaped elements maybe individually cut into a desired shape (such as trapezoid or triangle) using a proper cutting method without indexing. In principle, the inventive method may be used to cut a substrate (such as a wafer) into elements of various shapes featuring two angled opposing major sides.

Furthermore, although in the illustrated embodiment, the two angled side-cutting directions are defined using a central line direction (isolation trenches 32 in FIG. 5) as a reference for defining angles ($\theta_1$ and $\theta_2$ in FIG. 2), the two side-cutting directions may also be defined using other types of references. For example, especially when the final elements do not have a central reference line such as the isolation trenches 32 in the embodiment, the two side cutting directions may be defined using a side edge of the substrate as the reference to measure the proper angles. If the efficient use of the substrate material is not a concern, the first cutting direction may even be determined arbitrarily on the surface of the substrate with the second cutting direction being subsequently determined using the first cutting direction as the reference.

In the illustrated embodiment, the two angled side-cutting directions are determined independently. However, at least in theory, once the first side-cutting direction is determined using the proper means (such as optically detectable fiducial marks), the second side-cutting direction may be determined using the first side-cutting direction as a reference.

The essence of the inventive method, therefore, is that two angled directions are defined and cuttings in the two angled directions are performed repetitively according to an indexing scheme.

Once the cutting directions are defined in principle, they must also be defined physically. That is, there must also be means for actually aligning the cutting machine (such as dicing blades) along these defined cutting directions. The preferred method for guiding such an alignment is based on optical detection. Optically detectable fiducial marks as illustrated in the embodiment is an example of such a method.

Fiducial marks 34a, 34b, 34c and 34d should be readily detectable, preferably by using an optical means, and further preferably by using a visible light.

Although crosshair type of fiducial marks are shown in FIGS. 5 and 7, marks of any shape may be used as long as they can precisely define desired coordinates.

The positions of fiducial marks 34a, 34b, 34c and 34d relative to the isolation trenches 32 not only determine the cutting directions and thus the geometric shape of the final individual elements as shown in FIGS. 1–2, but also determine the relative sizes of the two halves 20a and 20b of the final bimorph 10 (FIG. 1). For example, a slight shift of fiducial marks 34a, 34b, 34c and 34d together to the left (or an equivalent shift of the cutting means in relation to the fiducial marks) will result in a left half 20b in the final bimorph 10 (FIG. 1) which is slightly larger than its corresponding right half 20a. Preferably, the positions of fiducial marks 34a, 34b, 34c and 34d relative to the isolation trenches 32 are chosen such that the resultant bimorph 10 would have two identical halves 20a and 20b.

Although not required, fiducial marks 34a, 34b, 34c and 34d as shown in FIGS. 6 and 7 are placed as close to the four corners 33a, 33b, 33c and 33d as possible while accommodating proper angles. Such an arrangement makes indexing as described herein less complicated. Larger separations among the fiducial marks also provide better precision.

When fiducial marks are used to physically define cutting directions, a pair of the fiducial marks are used to define a cutting direction. In the illustrated embodiment, for example, a first pair of fiducial marks (34a and 34b) are used to define the first cutting direction fiducial marks, second pair of fiducial marks (34c and 34d) are used to define the second cutting direction, while a third pair of fiducial marks (34a and 34c, or 34b and 34d) are used to define the transverse cutting direction. Although in the above selection of pairs of fiducial marks, fiducial mark 34c in the second pair is different and distanced from fiducial mark 34a, it is not required to be so. For example, if fiducial mark 34d is properly placed on the substrate 30, it is in principle possible to define the second cutting direction using a pair of fiducial marks consisting of 34a and 34d, rather than 34c and 34d. However, this latter alternative requires that fiducial mark 34d be relatively close to 34b and thus placing the pair of fiducial marks (i.e., 34a and 34d) that physically define the second cutting direction away from edges and toward the center part of the substrate 30. As described above, this might result in complication of the actual alignment of the cutting means and also potentially lower precision.

Similarly, additional fiducial marks other than those that are used to define the first and second cutting directions may be used to define the third cutting direction. For example, instead of using 34a and 34b, or 34b and 34d to define the transverse cutting direction, additional fiducial marks may be provided on the substrate 30 for such purpose. However, for the sake of simplicity, it is preferred that as few as possible fiducial marks have to be provided on the substrate.

Figure 9:
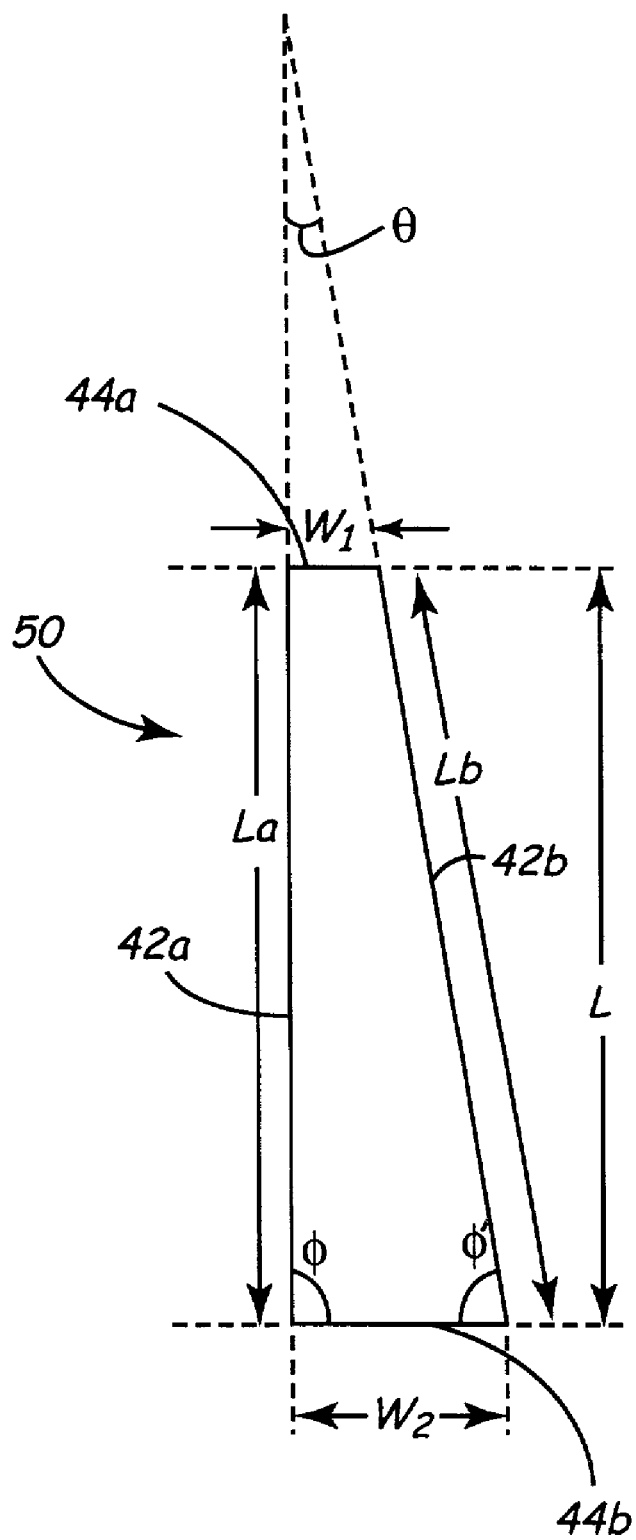
FIG. 9 illustrates a four-sided trapezoid shaped element that can be made using the inventive method.

In general, the inventive method can be used to make a plurality of 4-sided trapezoid-shaped elements having common feature angles. As shown in FIG. 9, a 4-sided trapezoid-shaped element that can be fabricated using the inventive method has a first and second angled opposing major sides 42a and 42b, and top and bottom sides 44a and 44b parallel to each other. Top 44a has a top width $w_1$, bottom 44b has a bottom width $w_2$ which is greater than the top width $w_1$. Each element has a length L measured vertically from the bottom to the top. First and second angled major sides 42a and 42b define a first common feature angle $\theta$ of the trapezoid. The bottom and the first define a second common feature angle $\phi$ of the trapezoid (in the trapezoid shown in FIG. 1, angle $\phi'$ between second angled side 42b and bottom 44b will be determined by basic trigonometrical relation once the above angles $\theta$ and $\phi$ are given). First angled side 42a has a length $l_a$. Second angled side has a length $L_b$. When the first and the second angled sides of the trapezoid are equidistant (i.e., $L_a=L_b$), the trapezoid is considered symmetrical in relation to an imagined central line (not shown). Although symmetric trapezoid elements may be preferred for other practical reasons in some applications, the inventive method, as described herein, is not limited to making symmetric trapezoid elements only.

To make a plurality of 4-sided trapezoid-shaped elements shown in FIG. 9 from a substrate having a surface many times larger than that of a single element, the surface of the substrate can be marked using a plurality of optically detectable marks which define an n-sided (n≧3) guiding polygon having a size substantially greater than that of a single 4-sided trapezoid-shaped element. To define the proper cutting directions which would result in elements having correct trapezoid shapes having two common feature angles as described above, the guiding polygon needs to have a first and second angled opposing major sides defining an angle that is equal to the first feature angle θ of an individual element (FIG. 9). The guiding polygon further needs to have a third side which forms with the first angled major side an angle that is equal to feature angle φ of an individual element (FIG. 9). The guiding polygon, however, is not restricted with respect to the other geometric aspects. For example, the guiding polygon does not have to be a trapezoid having a top and a bottom that are parallel to each other.

The guiding polygon determines the cutting directions. Plurality of cuts are performed in each cutting direction in a manner as described previously in this disclosure. The resultant trapezoid elements have common feature angles θ and φ, meaning that angles θ are identical in all elements, and so are angles φ. The resultant trapezoid elements are not required to be identical to each other with respect to other geometric aspects such as their widths and lengths. However, for simplicity, it is preferred that cuttings in each cutting direction is indexed uniformly to result in identical trapezoid elements.

It should be noted that although the cutting directions determine the essential features of the resultant individual elements and the inventive method is best used to fabricate identical elements, the method can also be used to fabricate elements that have the same essential features but nonetheless are not identical to each other. For example, with all the cutting directions determined, variation in the final elements can still be created by varying the index spacings in each cutting direction.

Isolation trenches 32 and fiducial marks 34a, 34b, 34c and 34d may be formed using an etching method such as photolithography, ion milling, reactive ion etching, and laser ablation. Furthermore, isolation trenches 32 and fiducial marks 34a, 34b, 34c and 34d may be formed in an integrated one-step process to assure precise alignment of the fiducial marks 34a, 34b, 34c and 34d with respect to the isolation trenches 32. Preferably, fiducial marks 34a, 34b, 34c and 34d and the isolation trenches 32 are formed on the same major surface (e.g., major surface 31 in FIG. 6) of the substrate 30 for easy optical detection.

The size of a final tapered in-plane piezoelectric bimorph 10 may vary depending on the intended application.

Finally, cutting in the two angled directions and the transverse direction as described above may be done either sequentially or simultaneously depending on the configuration of the dicing means and does not have to be done in the particular order as described above.

The unique method of defining separate cutting directions at different angles and indexing multiple cuttings in each direction makes integrated and systematic cutting possible. The method enables highly efficient quantity production of tapered in-plane bimorphs from a substrate of a size many times that of a single element.

Although the present invention has been described with reference to preferred embodiments, workers skilled in the art will recognize that changes may be made in form and detail without departing from the spirit and scope of the invention.

The invention claimed is:

1. A method for fabricating tapered elements from a substrate having a size many times that of a single element, the method comprising:
   cutting the substrate a plurality of times along a first cutting direction to result in a first set of cuts, each cut being spaced from an adjacent cut by a first distance;
   cutting the substrate a plurality of times along a second cutting direction resulting in second set of cuts, each cut being spaced from an adjacent cut by a second distance;
   wherein the first cutting direction and the second cutting direction intersect to form a feature angle less than about 90 degrees.

2. The method of claim 1, wherein the first distance and the second distance are about equal.

3. The method of claim 1, further comprising:
   cutting the substrate a plurality of times along a third cutting direction to result in a third set of cuts.

4. The method of claim 3, wherein each cut of the third set of cuts is separated from an adjacent cut by a third distance.

5. The method of claim 3, further comprising:
   providing at least three detectable marks on the substrate;
   selecting a first pair of marks to define the first cutting direction;
   selecting a second pair of marks to define the second cutting direction, wherein at least one mark in the second pair of marks is not included in the first pair of marks; and
   selecting a third pair of marks to define the third cutting direction, wherein the third pair of marks is different from both the first pair of marks and the second pair of marks by at least one mark.

6. The method of claim 5, wherein the substrate has peripheral edges, and the at least three detectable marks are placed close to the peripheral edges such that the marks are separated from each other as far as possible while still accommodating proper cutting directions.

7. The method of claim 5, wherein the detectable marks include a first mark, a second mark, a third mark, and a fourth mark, the first pair of marks includes the first mark and the second mark, the second pair of marks includes the third mark and the fourth mark, and the third pair of marks includes either the first mark and the third mark or the second mark and the fourth mark.

8. The method of claim 6, wherein the first mark, the second mark, the third mark, and the fourth mark are cross-hair type marks capable of optically indicating a precise reference point.

9. The method of claim 1, wherein the substrate comprises a piezoelectric material.

10. The method of claim 1, further comprising:
    forming isolation trenches on the substrate, the resultant isolation trenches being parallel to each other and aligned in a trench direction forming a first angle with the first cutting direction and a second angle with the second cutting direction, each trench being spaced from an adjacent trench by a trench distance.

11. The method of claim 10, further comprising:
    forming the substrate of a piezoelectric material; and
    cutting the substrate into an plurality of elements, so that each element is formed as an in-plane piezoelectric bimorph, and the isolation trenches divide each one of the in-plane piezoelectric bimorphs into two in-plane piezoelectric portions.

12. The method of claim 10, wherein the isolation trenches are formed using a method selected from a group consisted of photolithography, ion milling, reactive ion etching, and laser ablation.

13. The method of claim 10, wherein the first angle and the second angle are equal to each other.

14. The method of claim 10, wherein the trench distances between two adjacent parallel trenches are substantially uniform.

15. The method of claim 1, further comprising:
providing at least three detectable marks on the substrate;
selecting a first pair of marks to define the first cutting direction; and
selecting a second pair of marks to define the second cutting direction, wherein the second pair of marks include at least one mark which is not included in the first pair of marks.

16. A method for fabricating tapered elements from a substrate, the method comprising:
cutting the substrate a plurality of times along a first cutting direction to result in a first set of cuts, each cut being spaced from an adjacent cut by a first distance;
cutting the substrate a plurality of times along a second cutting direction resulting in second set of cuts, each cut being spaced from an adjacent cut by a second distance; and
cutting the substrate a plurality of times along the third cutting direction to result in a third set of cuts, each cut being spaced from an adjacent cut by a third distance.

17. The method of claim 16, further comprising:
providing at least three detectable marks on the substrate;
selecting a first pair of marks to define the first cutting direction;
selecting a second pair of marks to define the second cutting direction, wherein at least one mark in the second pair of marks is not included in the first pair of marks; and
selecting a third pair of marks to define the third cutting direction, wherein the third pair of marks is different from both the first and second pairs of marks by at least one mark.

18. The method of claim 17, wherein the substrate has peripheral edges, and the at least three detectable marks are placed close to the peripheral edges such that the marks are separated from each other as far as possible while still accommodating proper cutting directions.

19. The method of claim 17, wherein the detectable marks include a first mark, a second mark, a third mark, and a fourth mark, the first pair of marks includes the first mark and the second mark, the second pair of marks includes the third mark and the fourth mark, and the third pair of marks includes either the first mark and the third mark or the second mark and the fourth mark.

20. The method of claim 19, wherein the first mark, the second mark, the third mark, and the fourth mark are cross-hair type marks capable of optically indicating a precise reference point.

21. A dicing method for making a plurality of 4-sided trapezoid elements from a substrate, each element having a first feature angle defined by a first angled side of the element and a second angled side of the element, and a second feature angle defined by a bottom side of the element and the first angled side or the second angled side of the element, the method comprising:
marking the surface of the substrate using a plurality of detectable marks, wherein the marks define an n-sided (n≧3) guiding polygon, the guiding polygon having a first angled side and a second angled side, wherein the first angled side and the second angled side define an angle equal to the first feature angle of the elements, and a third side, wherein the third side and one of the first angled side or the second angled side define an angle equal to the second feature angle of the elements;
cutting the substrate a plurality of times along a first cutting direction parallel to the first angled side of the guiding polygon, each cut being spaced from an adjacent cut by a distance about equal to a bottom width of the elements;
cutting the substrate a plurality of times along a second cutting direction parallel to the second angled side of the guiding polygon, each cut being spaced from an adjacent cut by a distance about equal to the bottom width of the elements; and
cutting the substrate a plurality of times along a third cutting direction parallel to the third side of the guiding polygon, each cut being spaced from an adjacent cut by a length of the corresponding elements.

22. The method of claim 21, wherein the lengths of the plurality of elements are identical.

23. The method of claim 21, wherein the bottom widths of the plurality of elements are identical.

24. The method of claim 21, wherein the plurality of detectable marks include a first mark, a second mark, a third mark, and a fourth mark which define a 4-sided guiding polygon.

25. A dicing method for making a plurality of trapezoid-shaped elements from a substrate, wherein each element has first angled side and a second angled side, a top, a bottom, and a vertical divider line from the top to the bottom, the first angled side and the divider line defining a first feature angle of the trapezoid elements, the second angled side and the divider line defining a second feature angle of the trapezoid elements, the bottom and one of the first side or the second side defining a third feature angle of the trapezoid elements, each element having a length measured from the top to the bottom of the element; the method comprising:
defining a vertical reference on the substrate;
defining a first cutting direction which forms an angle with the vertical reference equal to the first feature angle of the trapezoid elements;
defining a second cutting direction which forms an angle with the vertical reference equal to the second feature angle of the trapezoid elements;
defining a third cutting direction which forms an angle with one of the first cutting direction or the second cutting direction equal to the third identical feature angle of the trapezoid elements;
cutting the substrate a plurality of times along the first cutting direction, each cut being spaced from an adjacent cut by a distance about equal to a bottom width of the corresponding elements;
cutting the substrate a plurality of times along the second cutting direction, each cut being spaced from an adjacent cut by a distance about equal to the bottom width of the corresponding elements; and
cutting the substrate a plurality of times along the third cutting direction, each cut being spaced from an adjacent cut by the length of the corresponding elements.

26. The method of claim 25, further comprising:
forming a plurality of isolation trenches on the substrate, the resultant isolation trenches being parallel, to each other and the vertical reference direction.

* * * * *